(12) United States Patent
Claussen et al.

(10) Patent No.: US 7,391,826 B2
(45) Date of Patent: Jun. 24, 2008

(54) DECODING METHOD AND APPARATUS

(75) Inventors: Holger Claussen, Swindon (GB); Hamid Reza Karimi, Swindon (GB)

(73) Assignee: Lucent Technologies Inc., Murray Hill, NJ (US)

( * ) Notice: Subject to any disclaimer, the term of this patent is extended or adjusted under 35 U.S.C. 154(b) by 841 days.

(21) Appl. No.: 10/637,788

(22) Filed: Aug. 8, 2003

(65) Prior Publication Data

US 2005/0031053 A1 Feb. 10, 2005

(51) Int. Cl.
*H03D 1/00* (2006.01)

(52) U.S. Cl. .................. 375/340; 375/341; 375/324; 375/285; 375/316; 714/755; 714/780; 714/794; 455/450; 455/278

(58) Field of Classification Search ............. 375/340, 375/232, 341, 324, 285, 316; 714/755, 794; 455/450, 278
See application file for complete search history.

(56) References Cited

U.S. PATENT DOCUMENTS 7,016,406 B1 * 3/2006 Phanse et al. ............ 375/232
7,032,156 B2 * 4/2006 Yu et al. .................. 714/755

FOREIGN PATENT DOCUMENTS

EP 1 383 246 1/2004

OTHER PUBLICATIONS

J. Vogt, et al, "Improving the max-log-MAP turbo decoder," *Electronics Letters IEE Stevenage*, GB, vol. 36, No. 23, (Nov. 9, 2000), pp. 1937-1939.
Peter H.-Y. Wu, et al, "Implementation of a Low Complexity, Low Power, Integer-Based Turbo Decoder," *2001 IEEE Global Telecommunications Conference*, San Antonio, TX, vol. 2 of 6, (Nov. 25-29, 2001), pp. 946-951.
European Search Report, Oct. 18, 2004.
"3rd Generation Partnership Project; Technical Specification Group Radio Access Network; Multiplexing and channel coding (FDD) (Release 5)", 3GPP TS 25.212 V5.0.0, (Mar. 2002).
Claude Berrou, et al, "Near Shannon Limit Error—Correcting Coding and Decoding : Turbo-Codes (1)", *IEEE*, (1993), pp. 1064-1070.
Stephan ten Brink, "Convergence Behavior of Iteratively Decoded Parallel Concatenated Codes", *IEEE Transactions on Communications*, vol. 49, No. 10, (Oct. 2001), pp. 1727-1737.

(Continued)

*Primary Examiner*—Chieh M. Fan
*Assistant Examiner*—Eva Puente

(57) ABSTRACT

A method of decoding is provided comprising processing iterations. In each processing iteration, there is a first Max-Log-MAP decoding operation giving rise to a systematic error due to the Max-Log approximation, and a first weighting operation to weight extrinsic information from the first decoding operation to be applied as a priori information to the second Max-Log-MAP decoding operation. This is followed by a second Max-Log-MAP decoding operation, also giving rise to a systematic error due to the Max-Log approximation, and a second weighting operation to weight extrinsic information from the second decoding to be applied as a priori information to the first Max-Log-MAP decoding of the next iteration. The weights are applied to compensate for the systematic error due to the Max-Log approximation made in the last Max-Log-MAP decoding operation.

8 Claims, 2 Drawing Sheets

OTHER PUBLICATIONS

Joachim Hagenauer, et al, "Iterative Decoding of Binary Block and Convolutional Codes", *IEEE Transactions on Information Theory*, vol. 42, No. 2, (Mar. 1996), pp. 429-445.

Thomas J. Richardson, et al, "Capacity of Low-Density Parity-Check Codes Under Message-Passing Decoding ", *IEEE Transactions on Information Theory*, vol. 47, No. 2, (Feb. 2001), pp. 599-618.

Patrick Robertson, et al, "A Comparison of Optimal and Sub-Optimal MAP Decoding Algorithms Operating in the Log Domain", *IEEE*, (1995), pp. 1009-1013.

Simon Haykin, "Neural Networks—A Comprehensive Foundation", *Second Edition*, pp. 500-501, Jul. 6, 1998.

Branka Vucetic, et al, "Turbo Codes—Principles and Applications", *Trellis Based Decoding of Linear Codes*, pp. 138-153, Jan. 15, 2000.

* cited by examiner

DECODING METHOD AND APPARATUS

FIELD OF THE INVENTION

The present invention relates to decoding, and more particularly, to decoding using a Max-Log-MAP decoding scheme.

DESCRIPTION OF THE RELATED ART

In the field of wireless telecommunications, in particular code division multiple access (CDMA), the demand for low-cost and low-power decoder chips, particularly for use in mobile user terminals has resulted in renewed interest in low-complexity decoders.

Several known approaches seeking to reduce complexity of an optimum Maximum A posteriori Probability (MAP) decoder are known, such as the Log-MAP and Max-Log-MAP schemes.

SUMMARY OF THE INVENTION

A method of decoding and a decoding apparatus according to the present invention are defined in the independent claims to which the reader should now refer. Preferred features are laid out in the dependent claims.

An example of the present invention is a method of decoding comprising processing iterations. In each processing iteration, there is a first Max-Log-MAP decoding operation giving rise to a systematic error due to the Max-Log approximation, and a first weighting operation to weight extrinsic information from the first decoding operation to be applied as a priori information to the second Max-Log-MAP decoding operation. This is followed by a second Max-Log-MAP decoding operation, also giving rise to a systematic error due to the Max-Log approximation, and a second weighting operation to weight extrinsic information from the second decoding to be applied as a priori information to the first Max-Log-MAP decoding of the next iteration. The weights are applied to compensate for the systematic error due to the Max-Log approximation made in the last Max-Log-MAP decoding operation.

It can thus be considered that a modification to a known Max-Log-MAP iterative decoder is provided, basically using correction weights for the extrinsic information at each iteration in order to correct the error caused by the Max-Log approximation in the extrinsic information provided by the previous decoding iteration. This can be achieved by applying optimised weight factors to the extrinsic information in each decoding iteration. Applying such weights not only allows the inherent advantages of a Max-Log-MAP decoder to be kept, such as of low complexity and insensitivity to input scaling, but tends to result in improved performance.

BRIEF DESCRIPTION OF THE DRAWINGS

An embodiment of the present invention will now be described by way of example and with reference to the drawings, in which.

DETAILED DESCRIPTION

As background, turbo-coding will first be explained generally, before focussing in on Log-MAP decoding and then Max-Log-MAP decoding. An improvement to Max-Log-MAP decoding will then be presented.

Turbo-decoding

Figure 1:
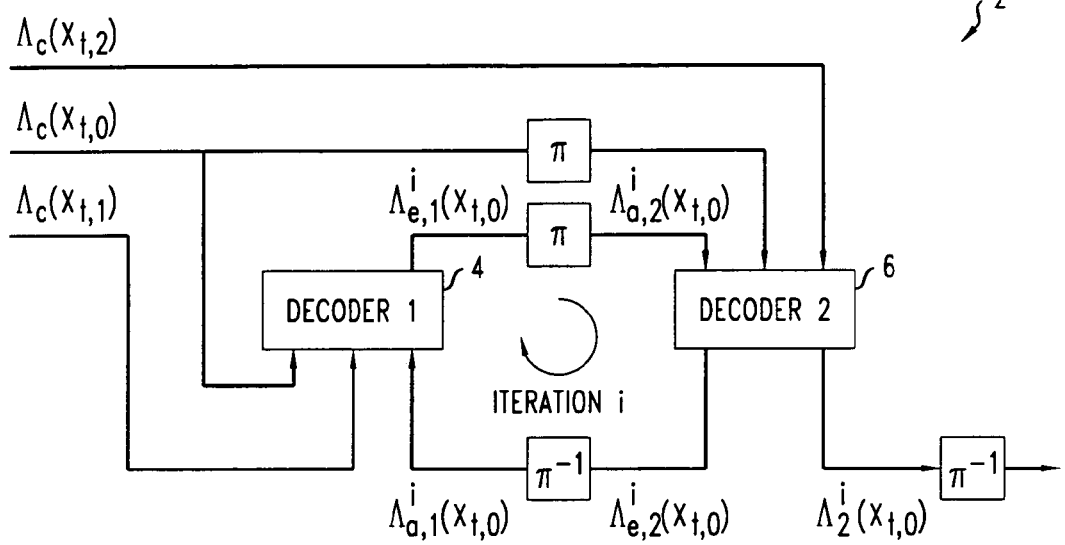
FIG. 1 is a diagram illustrating a turbo-decoder for parallel concatenated codes (PRIOR ART)

FIG. 1 shows a known turbo-decoder 2 for a parallel concatenated code of rate ⅓ (i.e. where one information bit has two associated parity bits), as presented for example in the book by B. Vucetic and J.Yuan, entitled "Turbo codes", published by Kluwer Academic Publishers, 2000. The code is termed parallel concatenated because two known recursive systematic convolutional encoders (not shown) within a turbo-encoder (not shown) have operated on the same set of input bits rather than one encoding the output of the other.

Given systematic (i.e. information) bit $x_{t,0}$ and parity (i.e. check sequence) bits $x_{t,1}$ and $x_{t,2}$, generated at the turbo-encoder (not shown) and assuming transmission through an additive white gaussian noise (AWGN) channel at time t, the corresponding received signals at the turbo-decoder 2 may be written as $\Lambda_c(x_{t,0})$, $\Lambda_c(x_{t,1})$ and $\Lambda_c(x_{t,2})$. Turbo decoding is performed in an iterative manner using two soft-output decoders 4,6, with the objective of improving data estimates from iteration i to iteration i+1. Each soft-output decoder 4,6 generates extrinsic information $\Lambda_e^i(x_t)$ on the systematic bits which then serves as a priori information $\Lambda_a^i(x_{t,0})$ for the other decoder 6,4. Extrinsic information is the probabilistic information gained on the reliability of the systematic bits. This information is improved on through decoding iterations. In order to minimise the probability of error propagation, the decoders 4, 6 are separated by interleaving process such that extrinsic information bits passing from decoder 4 to decoder 6 are interleaved, and extrinsic information bits passing from decoder 6 to decoder 4 are de-interleaved.

As regards, a choice of soft output decoders, 4,6, a maximum a posteriori probability (MAP) scheme would be the optimum decoding scheme in the sense that it results in a minimum probability of bit error. However, the MAP scheme is computationally complex and, as a result is usually implemented in the logarithmic domain in the form of Log-MAP or Max-Log-MAP scheme. While the former is a mathematical equivalent of MAP, the latter scheme involves an approximation which results in even lower complexity, albeit at the expense of some degradation in performance.

For further background, the reader is referred to the book by B. Vucetic and J. Yuan, entitled "Turbo codes", published by Kluwer Academic Publishers, 2000.

Log-MAP Algorithm

The known log-domain implementation of the MAP scheme requires log-likelihood ratios (LLR) of the transmitted bits at the input of the decoder. These LLRs are of the form $$\Lambda(x) = \log\frac{\Pr(x=+1)}{\Pr(x=-1)} = \frac{2}{\sigma_n^2}r \qquad (1)$$

where Pr(A) represents the probability of event A, x is the value of the transmitted bit, r=x+n is the received signal at the output of an additive white gaussian noise (AWGN) channel where x is the data value, and n is the noise assumed to have an expected value $E\{|n|^2\}=\sigma_n^2$ where $\sigma_n^2$ is the variance of the noise.

Given LLRs for the systematic and parity bits as well as a priori LLRs for the systematic bits, the Log-MAP decoder computes new LLRs for the systematic bits as follows:

$$\Lambda(x_{t,0}) = \log \frac{\sum_{l=0}^{M_s-1} \exp\{\overline{\alpha}_{t-1}(l') + \overline{\gamma}_t^1(l',l) + \overline{\beta}_t(l)\}}{\sum_{l=0}^{M_s-1} \exp\{\overline{\alpha}_{t-1}(l') + \overline{\gamma}_t^0(l',l) + \overline{\beta}_t(l)\}} \qquad (2)$$

$$= \Lambda_a(x_t) + \Lambda_c(x_t) + \Lambda_e(x_t)$$

where $\gamma_t^q(l',l)$ denotes the logarithmic transition probability for a transition from state l' to state l of the encoder trellis at time instant t given that the systematic bit takes on value q{1,0} and $M_s$ is the total number of states in the trellis. (For further explanation of trellis structures the reader is again referred to the Vucetic and Yuan book).

Note that the new information at the decoder output regarding the systematic bits is encapsulated in the extrinsic information term $\Lambda_e(x_{t,0})$. Coefficients $\alpha_t(l')$ are accumulated measures of transition probability at time t in the forward direction in the trellis. Coefficients $\beta_t(l)$ are accumulated measures of transition probability at time t in the backward direction in the trellis. For a data block corresponding to systematic bits $x_{1,0}$ to $x_{t,0}$ and parity bits $x_{1,1}$ to $x_{t,1}$, these coefficients are calculated as described below.

Using the following initial values in a forward direction:

$$\overline{\alpha}_0(0)=0 \text{ and } \overline{\alpha}_0(l)=-\infty \text{ for } l\neq 0 \qquad (3),$$

the coefficients are calculated as $$\overline{\gamma}_t^q(l',l) = \frac{\{\Lambda_a(x_{t,0}) + \Lambda_c(x_{t,0})\}x_{t,0}^q + \Lambda_c(x_{t,1})x_{t,1}^q}{2}, \text{ and} \qquad (4)$$

$$\overline{\alpha}_t(l) = \sum_{l'=0}^{M_s-1} \sum_{q\in(0,1)} \exp\{\overline{\alpha}_{t-1}(l') + \overline{\gamma}_t^q(l',l)\}. \qquad (5)$$

Using the following initial values in the backward direction:

$$\overline{\beta}_t(0)=0 \text{ and } \overline{\beta}_t(l)=-\infty \text{ for } l\neq 0 \qquad (6),$$

the coefficients are calculated as $$\overline{\beta}_t(l) = \sum_{l'=0}^{M_s-1} \sum_{q\in(0,1)} \exp\{\overline{\beta}_{t+1}(l') + \overline{\gamma}_{t+1}^q(l,l')\}. \qquad (7)$$

Equation (2) is readily implemented using the known Jacobian equality $$\log(e^{\delta_1}+e^{\delta_2})=\max(\delta_1,\delta_2)+\log(1+e^{-|\delta_2-\delta_1|}) \qquad (8)$$

and using a look up table to evaluate the correction function $\log(1+e^{-|\delta_2-\delta_1|})$.

Max-Log-MAP decoding

Figure 2:
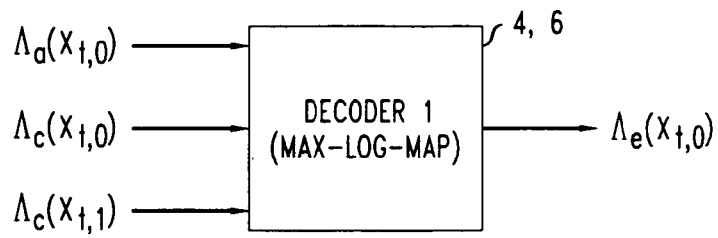
FIG. 2 is a diagram illustrating a known Max-Log-MAP decoder (PRIOR ART)

It is known that the complexity of the Log-MAP scheme can be further reduced by using the so-called Max-Log approximation, namely $$\log(e^{\delta_1}+e^{\delta_2}+\ldots)\approx\max(\delta_1,\delta_2,\ldots) \qquad (9)$$

for evaluating Equation (2). (log, of course, denotes natural logarithm, i.e. $\log_e$). The Max-Log-MAP scheme is often the preferred choice for implementing a MAP decoder, for example as shown in FIG. 2, since it has the advantage that its operation is insensitive to a scaling of the input LLRs. This means that knowledge or estimation of the channel's noise variance $\sigma_n^2$ is not required.

However, the known Max-Log approximation leads to accumulating a bias in the decoder output (extrinsic information), i.e. the Max-Log approximation results in biased soft outputs. A bias is, of course, an average of errors over time. This is due to the fact that the known Max-Log-MAP scheme uses the mathematical approximation of Equation (9) to simplify the computation of extrinsic information $\Lambda_e(X_{t,0})$. This approximation results in an error which accumulates from iteration to iteration and impedes the convergence of the turbo-decoder. Since in a turbo-decoder, each decoder output becomes a priori information for the following decoding process, the bias leads to sub-optimal combining proportions between the channel input and the a priori information, thereby degrading the performance of the decoder. In consequence, the known turbo-decoding process may not converge when the known Max-Log-MAP scheme is used for the constituent decoding processes.

Maximum Mutual Information Combining

The inventors recognised these errors as a problem and so wanted to correct for such errors in an efficient manner whilst maintaining the benefits of the Max-Log-MAP approach.

As mentioned above (see Equation (4)), the central operation in the known Max-Log-MAP scheme is the computation of logarithmic transition probabilities of the form $$\overline{\gamma}_t^q(l',l) = \frac{1}{2}\{\{\Lambda_a(x_{t,0}) + \Lambda_c(x_{t,0})\}x_{t,0}^q + \Lambda_c(x_{t,1})x_{t,1}^q\} \qquad (10)$$

where $\Lambda_a(X_{t,0})$, $\Lambda_c(X_{t,0})$ and $\Lambda_c(x_{t,l})$ are inputs to the constituent decoder.

Figure 3:
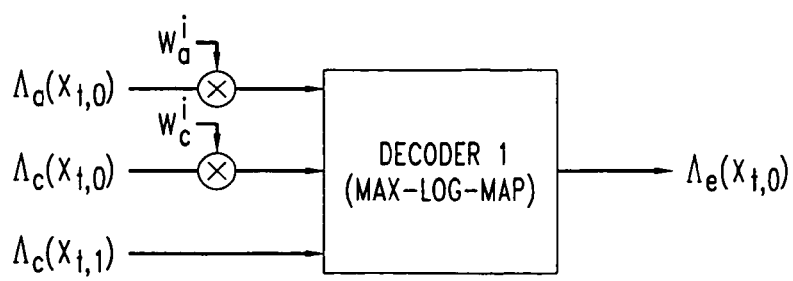
FIG. 3 is a diagram illustrating a Max-Log-MAP decoder according to the present invention.

The inventors realised that bias produced by the Max-Log-MAP scheme should be corrected by appropriate scaling of the terms $\Lambda_a(X_{t,0})$ and $\Lambda_c(X_{t,0})$ in the above equation by weights $W_a^i$ and $w_e^i$, resulting in $$\overline{\gamma}_t^q(l',l) = \frac{1}{2}\{\{w_a^i\Lambda_a(x_{t,0}) + w_c^i\Lambda_c(x_{t,0})\}x_{t,0}^q + \Lambda_c(x_{t,1})x_{t,1}^q\} \qquad (11)$$

where i represents the iteration index. This is illustrated in FIG. 3, which shows a weight $W_a^i$ applied to a priori information $\Lambda_a(X_{t,0})$, and a weight $w_c^i$ applied to systematic information (LLRs) $\Lambda_c(X_{t,0})$ applied to a Max-Log-MAP decoder. The weights are normalised as described later in this text such that the ratio between the LLRs representing systematic and parity bits is not disturbed.

This correction is simple and effective, and retains the advantage of Max-Log-MAP decoding in that soft inputs in the form of scaled LLRs are accepted.

Determination of Weights

The optimum values of the weights $W_a^i$ and $W_c^i$ to be applied are those that maximise the transfer of mutual information from one Max-Log-MAP decoder to the other at every iteration. Mutual information is, of course the level of information as to knowledge of a data sequence. These optimum values can be mathematically written as $$\begin{bmatrix} w_{OPT,a}^i \\ w_{OPT,c}^i \end{bmatrix} = (R_\varepsilon^i)^{\frac{T}{2}} eig_{max}\left\{(R_\varepsilon^i)^{\frac{-1}{2}}(R_{\lambda+\varepsilon}^i)^{\frac{T}{2}}(R_\varepsilon^i)^{\frac{-T}{2}}\right\} \quad (12)$$

where $eig_{max}(A)$ denotes the eigenvector corresponding to the largest eigenvalue of matrix A, and R are correlation matrices defined later on in this text. Equation (12) has more than one solution, but any of the solutions is optimum in maximising mutual information.

The above-mentioned optimum weights are both normalised (divided) by $W_{OPT,C}^i$ so that the weights to be applied become $$\begin{bmatrix} w_{OPT,a}^i \\ w_{OPT,c}^i \end{bmatrix} \rightarrow \begin{bmatrix} w_{OPT,a}^i / w_{OPT,c}^i \\ 1 \end{bmatrix} \quad (13)$$

This normalisation is required to ensure that the natural ratio between $\Lambda_c(x_{t,0})$ and $\Lambda_c(x_{t,1})$ remains undisturbed.

Computation of the weights in Equation (12) requires the (2×2) matrices $R_\varepsilon^i = R_{\lambda+\varepsilon}^i - R_\lambda^i$ and $R_{\lambda+\varepsilon}^i$ to be computed. These are:

$$R_{\lambda+\varepsilon}^i = \begin{bmatrix} E\{\Lambda_a^i(x_{t,0})\Lambda_a^i(x_{t,0})\} & E\{\Lambda_a^i(x_{t,0})\Lambda_c^i(x_{t,0})\} \\ E\{\Lambda_c^i(x_{t,0})\Lambda_a^i(x_{t,0})\} & E\{\Lambda_c^i(x_{t,0})\Lambda_c^i(x_{t,0})\} \end{bmatrix}$$

$$R_\lambda^i = \begin{bmatrix} E\{\lambda_a^i(x_{t,0})\lambda_a^i(x_{t,0})\} & E\{\lambda_a^i(x_{t,0})\lambda_c^i(x_{t,0})\} \\ E\{\lambda_c^i(x_{t,0})\lambda_a^i(x_{t,0})\} & E\{\lambda_c^i(x_{t,0})\lambda_c^i(x_{t,0})\} \end{bmatrix}$$

where $\Lambda_a^i(x_{t,0}) = \lambda_{t,a}^i + \epsilon_{t,a}^i$ and $\Lambda_c^i(x_{t,0}) = \lambda_{t,c}^i + \epsilon_{t,c}^i$, where $\lambda_{t,a}^i$ and $\lambda_{t,c}^i$ are the notional uncorrupted LLR values, $\epsilon_{t,a}^i$ and $\epsilon_{t,c}^i$ are the errors in LLR as detected compares to the notional uncorrupted LLR values, and "E" denotes statistical mean.

It is proposed that the above statistical means be computed by averaging over a number of data blocks containing a total of say, N, information bits. In other words:

$$R_{\lambda+\varepsilon}^i = \begin{bmatrix} \frac{1}{N}\sum_{t=1}^N \Lambda_a^i(x_{t,0})\Lambda_a^i(x_{t,0}) & \frac{1}{N}\sum_{t=1}^N \Lambda_a^i(x_{t,0})\Lambda_c^i(x_{t,0}) \\ \frac{1}{N}\sum_{t=1}^N \Lambda_c^i(x_{t,0})\Lambda_a^i(x_{t,0}) & \frac{1}{N}\sum_{t=1}^N \Lambda_c^i(x_{t,0})\Lambda_c^i(x_{t,0}) \end{bmatrix} \text{ and} \quad (14)$$

$$R_\lambda^i = \begin{bmatrix} \alpha^i \alpha^i & \alpha^i \beta^i \\ \alpha^i \beta^i & \beta^i \beta^i \end{bmatrix} \text{ where} \quad (15)$$

$$\alpha^i = \frac{1}{N}\sum_{t=1}^N \Lambda_a^i(x_{t,0}) x_{t,0} \quad \beta^i = \frac{1}{N}\sum_{t=1}^N \Lambda_c^i(x_{t,0}) x_{t,0} \quad (16)$$

The above operations to determine weights are performed only once and off-line.

Figure 4:
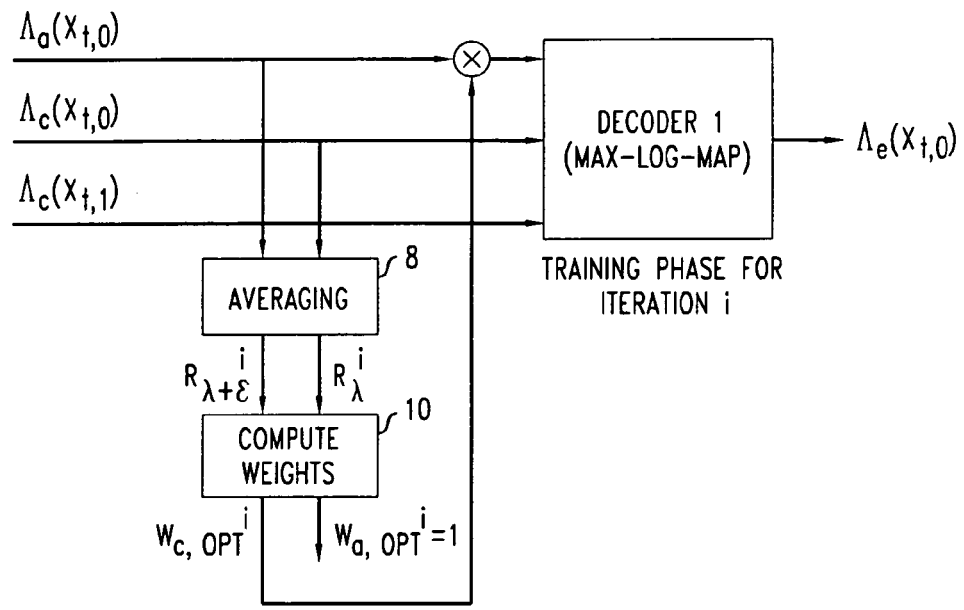
FIG. 4 is a diagram illustrating determination of weights to be applied to the Max-Log-MAP decoder shown in FIG. 3.

The averaging operations defined by equation (16) are undertaken in the average determining processor 8 shown in FIG. 4. Weight determinator 10 then calculated the weights according to equation (12) and normalises as per equation (13).

Example System

Figure 5:
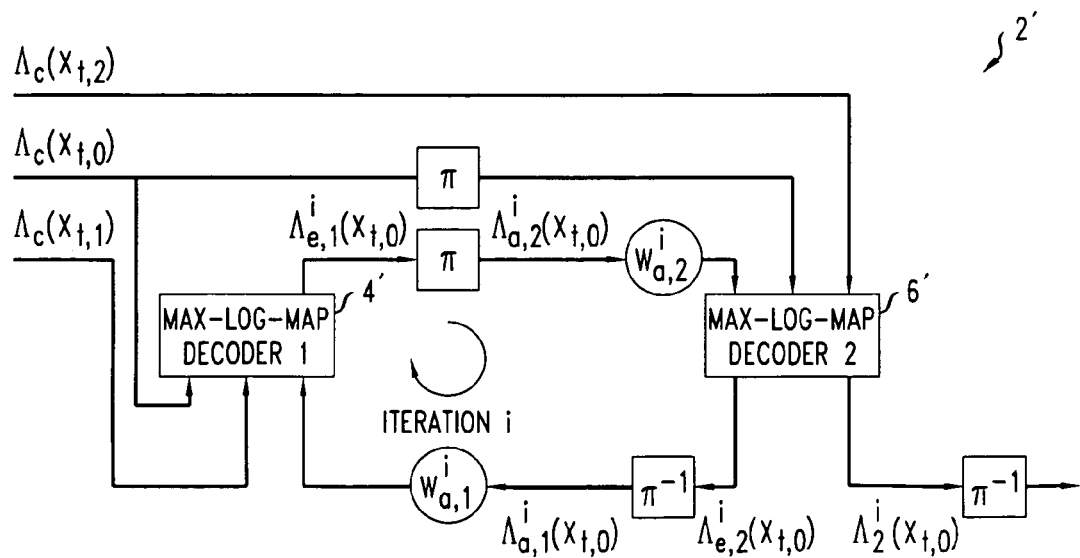
FIG. 5 is a diagram illustrating a turbo-decoder for parallel concatenated codes including the Max-Log-MAP decoder shown in FIGS. 3 and 4.

FIG. 5 shows, by way of review, the resulting turbo-decoder 2' for a parallel concatenated code of rate ⅓ (i.e. where one information bit has two associated parity bits).

Given systematic (i.e. information) bit $x_{t,0}$ and parity (i.e. check sequence) bits $x_{t,1}$ and $x_{t,2}$, generated at the turbo-encoder (not shown) and assuming transmission through an additive white gaussian noise (AWGN) channel at time t, the corresponding received signals at the turbo-decoder 2' may be written as $\Lambda_c(x_{t,0})$, $\Lambda_c(x_{t,1})$ and $\Lambda_c(x_{t,2})$.

Turbo decoding is performed in an iterative manner using two Max-log-MAP decoders 4',6' of known type as described above, with the objective of improving the data estimates from iteration i to iteration i+1. Each soft-output decoder 4',6' generates extrinsic information $\Lambda_e^i(x_t)$ on the systematic bits which then serves as a priori information $\Lambda_a^i(x_{t,0})$ for the other decoder. The Extrinsic information is the probabilistic information gained on the reliability of the systematic bits. This information is improved on through decoding iterations. In order to minimise the probability of error propagation, the decoders 4', 6' are separated by interleaving process such that extrinsic information bits passing from decoder 4' to decoder 6' are interleaved, and extrinsic information bits passing from decoder 6' to decoder 4' are de-interleaved.

Importantly, the a priori information is weighted as described above to remove the bias caused by the Max-log approximation.

The weights are determined by feeding the turbo-decoder with the channel outputs $\{\Lambda_c(x_{t,0}), \Lambda_c(x_{t,0}), \Lambda_c(x_{t,1})\}$ t=1 . . . N and performing I turbo iterations as per normal operation. By observing the constituent decoder inputs $\Lambda_c(x_{t,0})$ and $\Lambda_a(x_{t,0})$ at each iteration, the coefficients $W_a^i$ are computed following Equations (12) to (16) as explained above.

To review, it was found that the performance of a decoder can be improved by using the modified Max-Log-MAP decoder to approach that of a decoder using the optimum Log-MAP or MAP decoders. This is achieved at the expense of only two additional multiplications (each multiplication being to apply a weight to a priori information for each decoder) per iteration for each systematic bit. The weights are to correct for a bias caused by the Max-Log approximation. The advantages of a Max-Log-MAP decoder can be maintained, namely its insensitivity to scaling of the log-likelihood, and that an estimate of noise variance is not required.

Since the weights need only be computed once for a particular turbo-decoder, the improved decoder retains the low complexity of a Max-Log-MAP approach. The values of optimal weights to be applied can be computed off-line.

We claim:

1. A method of decoding comprising processing iterations, each processing iteration comprising:
   performing a first Max-Log-MAP decoding operation giving rise to a systematic error due to the Max-Log approximation,
   performing a first weighting operation of applying weights to extrinsic information from the first decoding operation to be applied as a priori information to a second Max-Log-MAP decoding operation,
   performing a second Max-Log-MAP decoding operation giving rise to a systematic error due to the Max-Log approximation, and performing a second weighting operation of applying weights to extrinsic information from the second decoding to be applied as a priori information to the first Max-Log-MAP decoding of the next iteration, in which each weighting operation is performed to compensate for the systematic error due to the Max-Log approximation made in the previous Max-Log-MAP decoding operation, in which the weights in each weighting operation have iteration-specific values.

2. A method according to claim 1, in which, a weight is applied to a priori information which is in the form of a Log Likelihood Ratio about a parity bit, and a weight is applied to further a priori information which is in the form of a Log Likelihood Ratio about a systematic bit.

3. A method according to claim 1, in which values of the weights to be applied relate to optimum weights, the optimum weights being optimum in maximising the transfer of mutual information from one Max-log-MAP decoding operation to the next.

4. A method according to claim 3, in which the optimum weights are normalised to provide the weights to be applied so as to maintain a natural ratio between $\Lambda_c(x_{t,0})$ and $\Lambda_c(x_{t,1})$ undisturbed, wherein $\Lambda_c(x_{t,0})$ is a priori information in the form of a Log Likelihood Ratio about a systematic bit, and $\Lambda_c(X_{t,1})$ is a priori information in the form of a Log Likelihood Ratio about a parity bit.

5. Decoding apparatus comprising a first Max-Log-MAP decoder, a first weight applicator, a second Max-Log-MAP decoder, and a second weight applicator, the decoder performing processing iterations, the first Max-Log-MAP decoder providing extrinsic information including a systematic error due to the Max-Log approximation, the first weight applicator being connected to the first Max-Log-MAP decoder so as to apply weights to the extrinsic information from the first decoder to compensate for the systematic error due to the Max-Log approximation and being connected to the second Max-Log-MAP decoder so as to provide the weighted extrinsic information as a priori information to the second Max-Log-MAP decoder, and the second Max-Log-MAP decoder providing extrinsic information including a systematic error due to the Max-Log approximation, the second weight applicator being connected to the second Max-Log-MAP decoder so as to apply weights to the extrinsic information from the second decoder to compensate for the systematic error due to the Max-Log approximation and being connected to the first Max-Log-MAP decoder so as to provide the weighted extrinsic information as a priori information to the first Max-Log-MAP decoder for the next processing iteration, in which the weights in each weight applicator have iteration-specific values.

6. Decoding apparatus according to claim 5, in which, a weight is applied to a priori information which is in the form of a Log Likelihood Ratio about a parity bit, and a weight is applied to a priori information which is in the form of a Log Likelihood Ratio about a systematic bit.

7. Decoding apparatus according to claim 5, in which values of the weights to be applied relate to optimum weights, the optimum weights being optimum in maximising the transfer of mutual information from one Max-log-MAP decoding operation to the next.

8. Decoding apparatus according to claim 7, in which the optimum weights are normalised to provide the weights to be applied so as to maintain a natural ratio between $\Lambda_c(x_{t,0})$ and $\Lambda_c(x_{t,1})$ undisturbed, wherein $\Lambda_c(X_{t,0})$ is a priori information in the form of a Log Likelihood Ratio about a systematic bit, and $\Lambda_c(X_{t,1})$ is a priori information in the form of a Log Likelihood Ratio about a parity bit.

* * * * *